US011694835B2

(12) United States Patent
Yen et al.

(10) Patent No.: US 11,694,835 B2
(45) Date of Patent: Jul. 4, 2023

(54) INDUCTOR DEVICE (71) Applicant: Realtek Semiconductor Corporation, Hsinchu (TW)

(72) Inventors: Hsiao-Tsung Yen, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 357 days.

(21) Appl. No.: 16/910,292

(22) Filed: Jun. 24, 2020

(65) Prior Publication Data
US 2021/0012946 A1 Jan. 14, 2021

Related U.S. Application Data (60) Provisional application No. 62/871,263, filed on Jul. 8, 2019.

(30) Foreign Application Priority Data

May 28, 2020 (TW) .................... 109117888

(51) Int. Cl.
H01F 27/28 (2006.01)
H03H 7/09 (2006.01)
H01F 27/29 (2006.01)
H01F 17/00 (2006.01)

(52) U.S. Cl.
CPC ..... *H01F 27/2804* (2013.01); *H01F 17/0013* (2013.01); *H01F 27/2828* (2013.01); *H01F 27/29* (2013.01); *H03H 7/09* (2013.01); *H01F 2017/004* (2013.01); *H01F 2017/0073* (2013.01); *H01F 2027/2809* (2013.01)

(58) Field of Classification Search
CPC .... H01F 27/2804; H01F 27/2828; H03H 7/09
USPC .................................. 333/181, 185; 336/200
See application file for complete search history.

(56) References Cited

U.S. PATENT DOCUMENTS

| 10,153,078 | B2 | 12/2018 | Yen et al. |
| 10,186,364 | B2 | 1/2019 | Yen et al. |
| 2013/0257577 | A1* | 10/2013 | Nazarian ............ H01F 27/2804 336/200 |
| 2019/0214185 | A1 | 7/2019 | Yen |
| 2019/0279809 | A1 | 9/2019 | Yen |

(Continued)

FOREIGN PATENT DOCUMENTS

| TW | 201703070 A | 1/2017 |
| TW | I643217 B | 12/2018 |

(Continued)

OTHER PUBLICATIONS

U.S. Appl. No. 16/829,112, filed Mar. 25, 2020.

(Continued)

*Primary Examiner* — Rakesh B Patel
(74) *Attorney, Agent, or Firm* — Locke Lord LLP; Tim Tingkang Xia, Esq.

(57) ABSTRACT

An inductor device includes a first trace, a second trace, and a double ring inductor. The first trace is disposed at a first area. The second trace is disposed at a second area. The double ring inductor is located at an outside of the first trace and the second trace. The double ring inductor is respectively coupled to the first trace and the second trace in an interlaced manner.

20 Claims, 5 Drawing Sheets

(56) References Cited

U.S. PATENT DOCUMENTS

2019/0392980 A1    12/2019    Yen

FOREIGN PATENT DOCUMENTS

| TW | I643218 B | 12/2018 |
|---|---|---|
| TW | I659437 B | 5/2019 |

OTHER PUBLICATIONS

U.S. Appl. No. 16/823,446, filed Mar. 19, 2020.
China Patent Office, the office action of the corresponding Chinese application No. 202010498993.5 dated May 7, 2021.

* cited by examiner

INDUCTOR DEVICE

RELATED APPLICATIONS

This application claims priority to and the benefit of U.S. Provisional Patent Application No. 62/871,263, filed on Jul. 8, 2019, and Taiwan Application Serial Number 109117888, filed on May 28, 2020, the entire contents of which are incorporated herein by reference as if fully set forth below in its entirety and for all applicable purposes.

BACKGROUND

Field of Invention

The present disclosure relates to an electronic device. More particularly, the present disclosure relates to an inductor device.

Description of Related Art

The various types of inductors according to the prior art have their advantages and disadvantages. For example, a spiral inductor has a higher Q value and a larger mutual inductance. For a spiral type twin inductor, it is hard to design a symmetric structure, and an application bandwidth of a twin inductor/transformer is relatively narrow. Therefore, the application ranges of the above inductors are all limited.

SUMMARY

One aspect of the present disclosure is to provide an inductor device. The inductor device includes a first trace, a second trace, and a double ring inductor. The first trace is disposed in a first area. The second trace is disposed in a second area. The double ring inductor is disposed at an outside of the first trace and the second trace. The double ring inductor is respectively coupled to the first trace and the second trace in an interlaced manner.

Therefore, based on the technical content of the present disclosure, the structure of the inductor device, especially, the structure design of the input port and the center-tap of the inductor device, is extremely symmetric. Besides, the inductance of the inductor device is enhanced through the design of the first trace and the second trace of the inductor device. In addition, the frequency where the self-resonant frequency (Fsr) of the inductor device occurs is effectively improved to move the frequency where the self-resonant frequency occurs to a higher frequency, thus enhancing the operation range of the inductor device and the quality factor (Q factor).

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

According to the usual mode of operation, various features and elements in the figures have not been drawn to scale, which are drawn to the best way to present specific features and elements related to the disclosure. In addition, among the different figures, the same or similar element symbols refer to similar elements/components.

DESCRIPTION OF THE EMBODIMENTS

Figure 1:
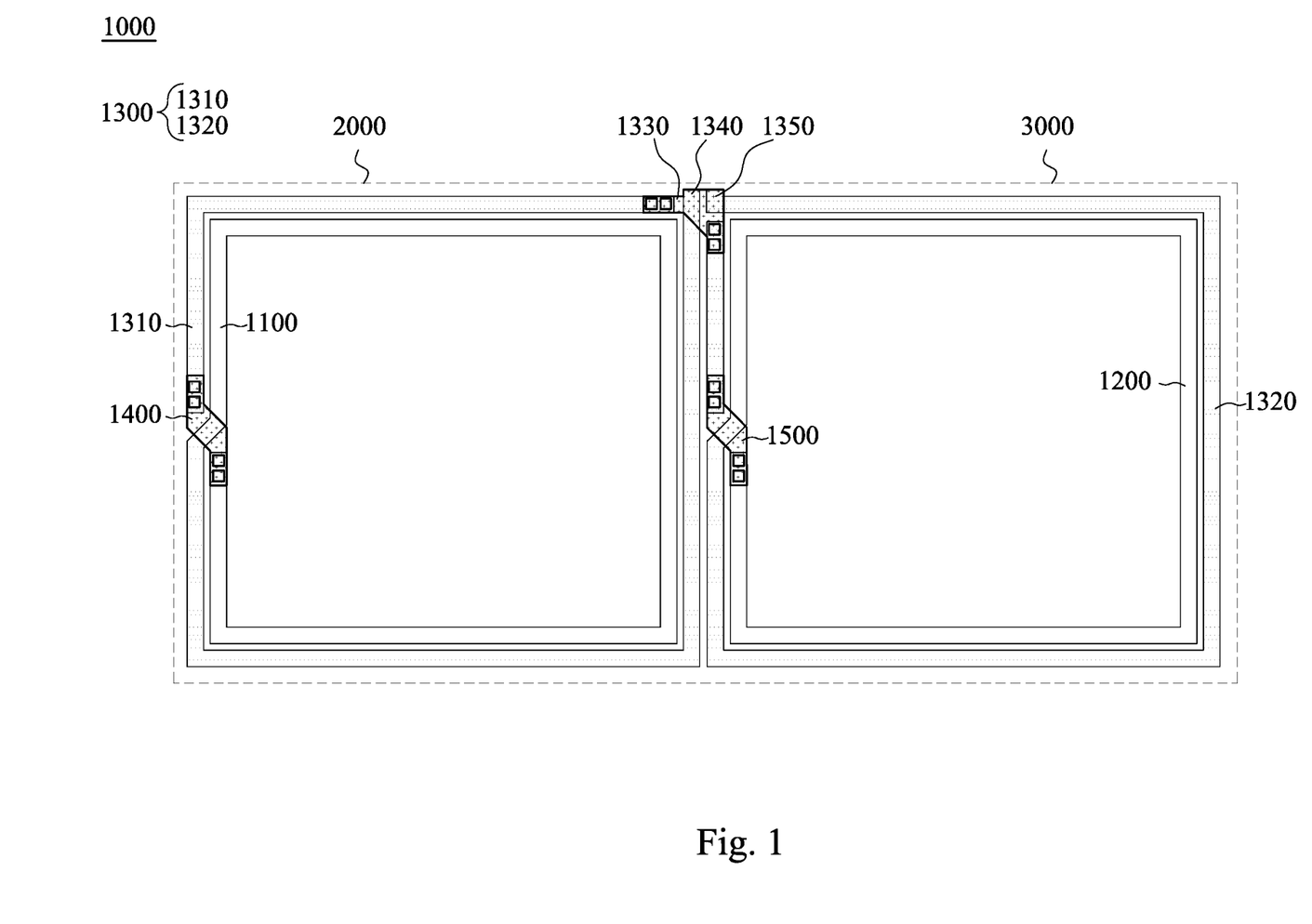
FIG. 1 depicts a schematic diagram of an inductor device according to one embodiment of the present disclosure.

FIG. 1 depicts a schematic diagram of an inductor device according to one embodiment of the present disclosure. As shown in the figure, the inductor device 1000 includes a first trace 1100, a second trace 1200 and a double ring inductor 1300.

With respect to the structure, the first trace 1100 is disposed in a first area 2000, and the second trace 1200 is disposed in a second area 3000. For example, the first trace 1100 is located in the left area of the figure, and the second trace 1200 is located in the right area of the figure.

In one embodiment, the first trace 1100 and the second trace 1200 are about symmetrical to each other on a basis of a junction of the first area 2000 and the second area 3000. For example, the first trace 1100 and the second trace 1200 can be symmetrically disposed (over 80%) in a mirror manner, or the first trace 1100 and the second trace 1200 can be symmetrically disposed (over 80%) in a duplicate manner. In other words, the symmetrical similarity of the first trace 1100 and the second trace 1200 is greater than 80%, and the above-mentioned symmetrical manner is mirror or duplicate. However, the present disclosure is not limited to the foregoing embodiments, and the symmetrical similarity of the first trace 1100 and the second trace 1200 can be greater than 60%, 70% or 90% depending on actual requirements.

In addition, the double ring inductor 1300 is disposed at an outside of the first trace 1100 and the second trace 1200, and the double ring inductor 1300 is respectively coupled to the first trace 1100 and the second trace 1200 in an interlaced manner. For example, the double ring inductor 1300 includes a third trace 1310 and a fourth trace 1320. The third trace 1310 is disposed in the first area 2000, and located at the outside of the first trace 1100. The fourth trace 1320 is disposed in the second area 3000, and located at the outside of the second trace 1200.

In one embodiment, the third trace 1310 and the fourth trace 1320 are coupled to each other at the junction of the first area 2000 and the second area 3000. Besides, the first trace 1100 and the third trace 1310 are coupled to each other in an interlaced manner at a side which is opposite to the junction (e.g., the left side of the figure). In addition, the second trace 1200 and the fourth trace 1320 are coupled to each other in an interlaced manner at the junction of the first area 2000 and the second area 3000 (e.g., the center of the figure).

In one embodiment, the double ring inductor 1300 further includes a first connector 1330. The third trace 1310 and the fourth trace 1320 are coupled to each other at a first side of the inductor device 100 (e.g., the upper side of the figure) through the first connector 1330.

In one embodiment, the double ring inductor 1300 further includes a first input/output (I/O) terminal 1340. The first input/output terminal 1340 is disposed in the third trace 1310. For example, one terminal of the third trace 1310 can be used as the first input/output terminal 1340. In another embodiment, the first trace 1100, the second trace 1200, the third trace 1310 (including the first input/output terminal 1340) and the fourth trace 1320 are disposed in a first layer. Besides, the first connector 1330 is disposed in a second layer, and crosses the first input/output terminal 1340.

In one embodiment, the double ring inductor 1300 further includes a second input/output terminal 1350. The second input/output terminal 1350 is disposed in the fourth trace 1320. For example, one terminal of the fourth trace 1320 can be used as the second input/output terminal 1350. In another embodiment, the first trace 1100, the second trace 1200, the third trace 1310 and the fourth trace 1320 (including the second input/output terminal 1350) is disposed in the first layer. Besides, the first connector 1330 is disposed in the second layer, and crosses the second input/output terminal 1350. In one embodiment, referring to FIG. 1, the first connector 1330 can cross the first input/output terminal 1340 and the second input/output terminal 1350 at the same time. However the present disclosure is not limited to the foregoing embodiments. In some cases, the first connector 1330, the first input/output terminal 1340 and the second input/output terminal 1350 can be disposed at another side of the inductor device 1000 (for example, the first connector 1330, the first input/output terminal 1340 and the second input/output terminal 1350 can be disposed at the lower side of the inductor device 1000) depending on actual requirements.

In one embodiment, the inductor device 1000 further includes a second connector 1400. The second connector 1400 is coupled to the first trace 1100 and the third trace 1310 at a side which is opposite to the junction of the first area 2000 and the second area 3000 (e.g., the left side of the figure). However the present disclosure is not limited to the foregoing embodiments of FIG. 1. In some cases, the first trace 1100 and the third trace 1310 can be coupled to each other at another side of the inductor device 1000 (for example, the first trace 1100 and the third trace 1310 can be coupled to each other at the upper side or the lower side of the inductor device 1000) depending on actual requirements.

In one embodiment, the inductor device 1000 further includes the third connector 1500. The third connector 1500 is coupled to the second trace 1200 and the fourth trace 1320 at the junction of the first area 2000 and the second area 3000. However the present disclosure is not limited to the foregoing embodiments of FIG. 1. In some cases, the second trace 1200 and the fourth trace 1320 can be coupled to each other at another side of the inductor device 1000 (for example, the second trace 1200 and the fourth trace 1320 can be coupled to each other at the upper side or the lower side of the inductor device 1000) depending on actual requirements. Furthermore, the present disclosure is not limited to the structure as shown in FIG. 1, and it is merely an example for illustrating one of the implements of the present disclosure.

Figure 2:
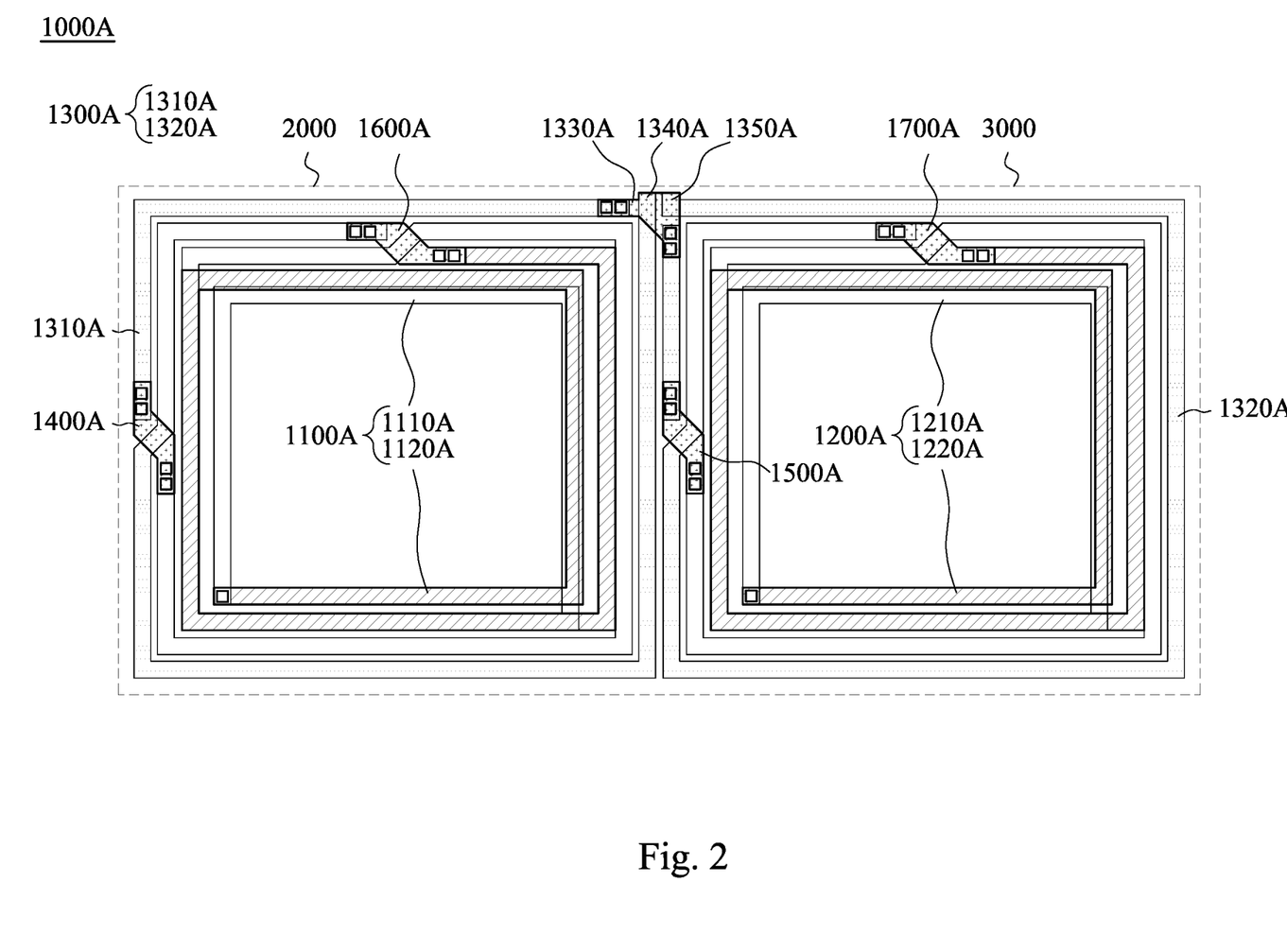
FIG. 2 depicts a schematic diagram of an inductor device according to one embodiment of the present disclosure.

FIG. 2 depicts a schematic diagram of an inductor device according to one embodiment of the present disclosure. Compared with the inductor device 1000 as shown in FIG. 1, the first trace 1100A of the inductor device 1000A in FIG. 2 includes a first sub-trace 1110A and a second sub-trace 1120A. Besides, the second trace 1200A of the inductor device 1000A in FIG. 2 includes a third sub-trace 1210A and a fourth sub-trace 1220A.

With respect to structure, the first sub-trace 1110A is disposed in the first area 2000. The second sub-trace 1120A is also disposed in the first area 2000. For example, the first sub-trace 1110A and the second sub-trace 1120A are all disposed in the left area of the figure. In one embodiment, the first sub-trace 1110A and the second sub-trace 1120A are disposed on different layers. For example, the first sub-trace 1110A can be disposed above the second sub-trace 1120A or disposed below the second sub-trace 1120A.

In one embodiment, the first sub-trace 1110A is coupled to the second sub-trace 1120A. For example, the first sub-trace 1110A and the second sub-trace 1120A are coupled to each other in an interlaced manner at the first side of the inductor device 1000A (e.g., the upper side of the figure). In addition, the inductor device 1000A further includes a connector 1600A. The first sub-trace 1110A and the second sub-trace 1120A can be coupled to each other through the connector 1600A in an interlaced manner at the first side. However, the present disclosure is not limited to the foregoing embodiments in FIG. 2, the first sub-trace 1110A and the second sub-trace 1120A can be coupled to each other at another side of the inductor device 1000A (For example, the first sub-trace 1110A and the second sub-trace 1120A can be coupled to each other at the lower side of the inductor device 1000A) depending on actual requirement.

In one embodiment, the third sub-trace 1210A is disposed in the second area 3000. The fourth sub-trace 1220A is also disposed in the second area 3000. For example, the third sub-trace 1210A and the fourth sub-trace 1220A are all disposed in the right area of the figure. In another embodiment, the third sub-trace 1210A and the fourth sub-trace 1220A are disposed on different layers. For example, the third sub-trace 1210A can be disposed above the fourth sub-trace 1220A or disposed below the fourth sub-trace 1220A.

In one embodiment, the third sub-trace 1210A is coupled to the fourth sub-trace 1220A. For example, the third sub-trace 1210A and the fourth sub-trace 1220A are coupled to each other in an interlaced manner at the first side of the inductor device 1000A (e.g., the upper side of the figure). In addition, the inductor device 1000A further includes a connector 1700A. The third sub-trace 1210A and the fourth sub-trace 1220A are coupled to each other through the connector 1700A in an interlaced manner at the first side. However, the present disclosure is not limited to the foregoing embodiments in FIG. 2, the third sub-trace 1210A and the fourth sub-trace 1220A can be coupled to each other at another side of the inductor device 1000A (for example, the third sub-trace 1210A and the fourth sub-trace 1220 are coupled to each other in an interlaced manner at the lower side of the inductor device 1000A) depending on actual requirements.

It is noted that, the element in FIG. 2, whose symbol is similar to the symbol of the element in FIG. 1, has similar structure feature in connection with the element in FIG. 1. Therefore, a detail description regarding the structure feature of the element in FIG. 2 is omitted herein for the sake of brevity. Furthermore, the present disclosure is not limited to the structure as shown in FIG. 2, and it is merely an example for illustrating one of the implements of the present disclosure.

Figure 3:
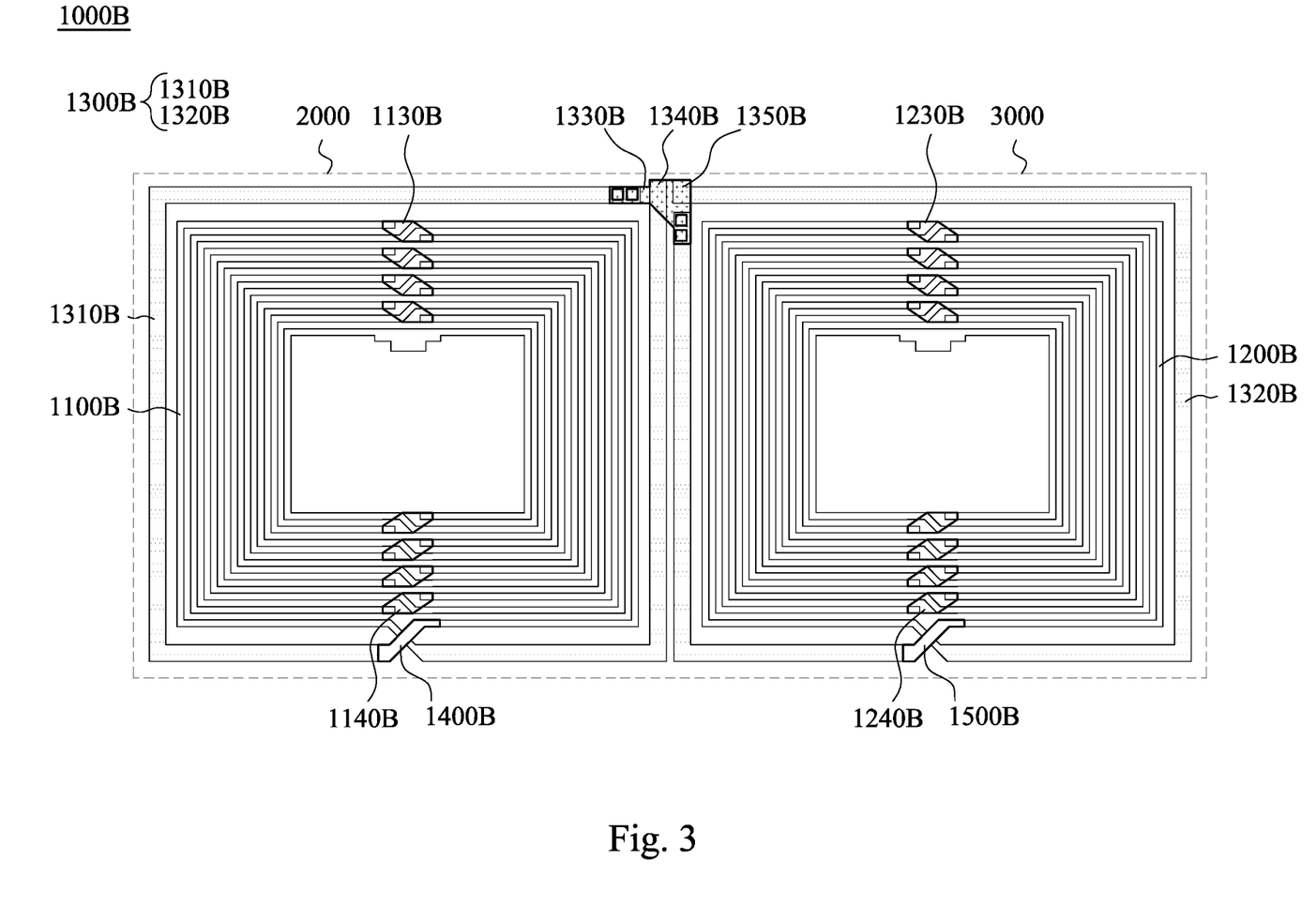
FIG. 3 depicts a schematic diagram of an inductor device according to one embodiment of the present disclosure.

FIG. 3 depicts a schematic diagram of an inductor device according to one embodiment of the present disclosure. Compared with the inductor device 1000 as shown in FIG.

1, the first trace 1100B of the inductor device 1000B in FIG. 3 includes a plurality of first wires. The first wire are coupled to each other in an interlaced manner at the first side of the inductor device 1000B (e.g., the upper side of the figure) and the second side of the inductor device 1000B (e.g., the lower side of the figure). For example, the inductor device 1000B further includes a connector 1130B and a connector 1140B. The first wires are coupled to each other through the connector 1130B in an interlaced manner at the first side of the inductor device 1000B, and the first wires are coupled to each other through the connector 1140B in an interlaced manner at the second side of the inductor device 1000B. However, the present disclosure is not limited to the foregoing embodiments in FIG. 3, the first wires can be coupled to each other at another side of the inductor device 1000B depending on actual requirements.

In addition, the second trace 1200B includes a plurality of second wires. The second wires are coupled to each other in an interlaced manner at the first side of the inductor device 1000B (e.g., the upper side of the figure) and the second side of the inductor device 1000B (e.g., the lower side of the figure). For example, the inductor device 1000B further includes a connector 1230B and a connector 1240B. The second wire are coupled to each other through the connector 1230B in an interlaced manner at the first side of the inductor device 1000B, and the second wires are coupled to each other through connector 1240B in an interlaced manner at the second side of the inductor device 1000B. However, the present disclosure is not limited to the foregoing embodiments in FIG. 3, the second wires are coupled to each other at another side of the inductor device 1000B depending on actual requirements.

It is noted that, the element in FIG. 3, whose symbol is similar to the symbol of the element in FIG. 1, has similar structure feature in connection with the element in FIG. 1. Therefore, a detail description regarding the structure feature of the element in FIG. 3 is omitted herein for the sake of brevity. Furthermore, the present disclosure is not limited to the structure as shown in FIG. 3, and it is merely an example for illustrating one of the implements of the present disclosure.

Figure 4:
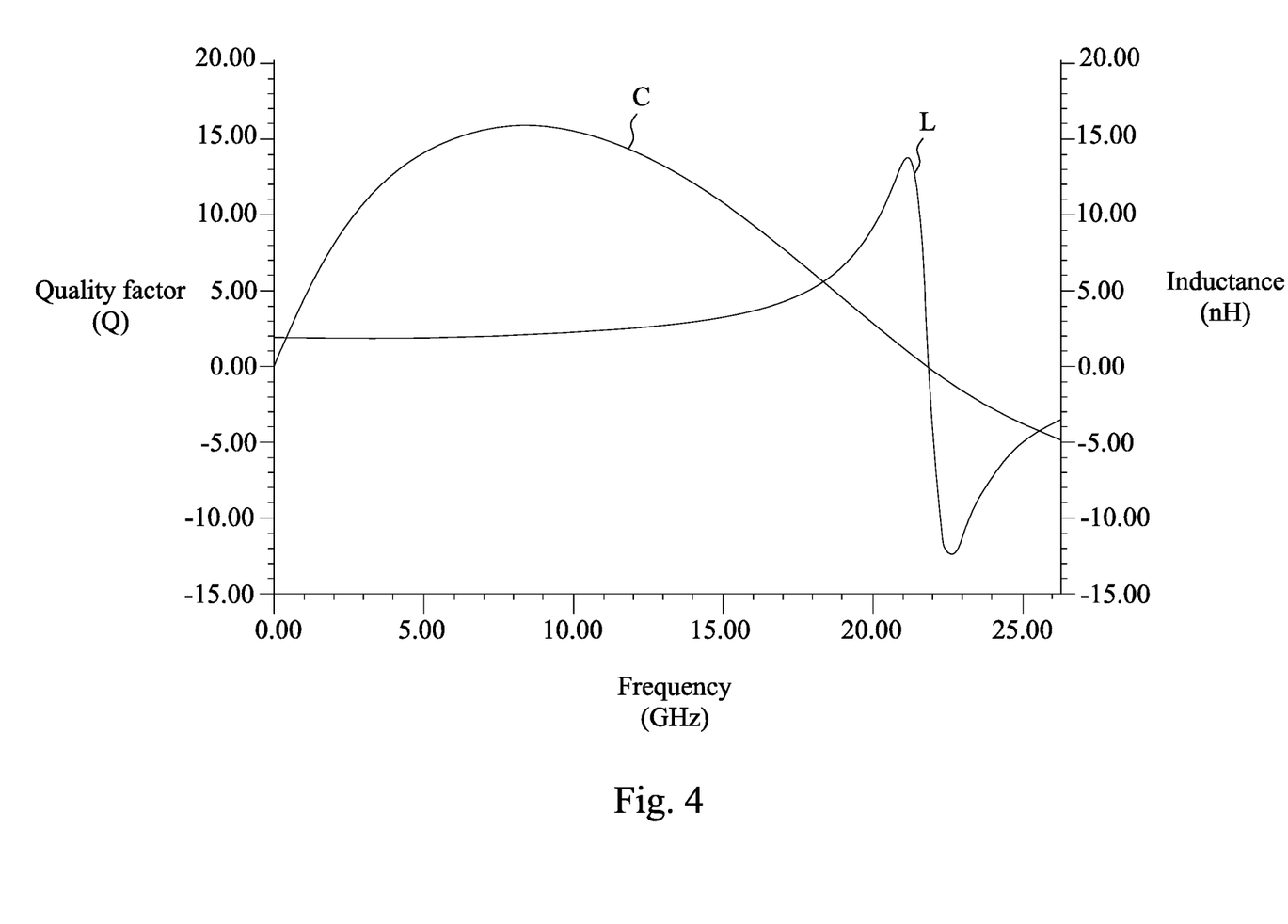
FIG. 4 depicts a schematic diagram of experimental data of an inductor device according to one embodiment of the present disclosure.

FIG. 4 depicts a schematic diagram of experimental data of the inductor device 1000 as shown in FIG. 1 according to one embodiment of the present disclosure. As shown in the figure, the experimental curve of the quality factor of the inductor device adopting the structural configuration of the present disclosure is C, and the experimental curve of the inductance value of the inductor device is L. As can be seen from the figure, the inductor device 1000 adopting the structure of the present disclosure has better quality factor (Q factor). For example, the best quality factor of the inductor device 100 is about 16. In addition, at a frequency of about 5 GHz, the quality factor of the curve C is about 15, and the inductance value of the curve L is about 2 nH.

In addition to that, the experimental curve L shows the self-resonant frequency (Fsr) is about 21 GHz. Since the frequency where the self-resonant frequency occurs is farther from the peak of the quality factor of the curve C, its effect on the quality factor is smaller. Additionally, as can be seen from FIG. 4, the flat range before the point at which the curve L starts to rise is longer, so that the operable range is wider.

Figure 5:
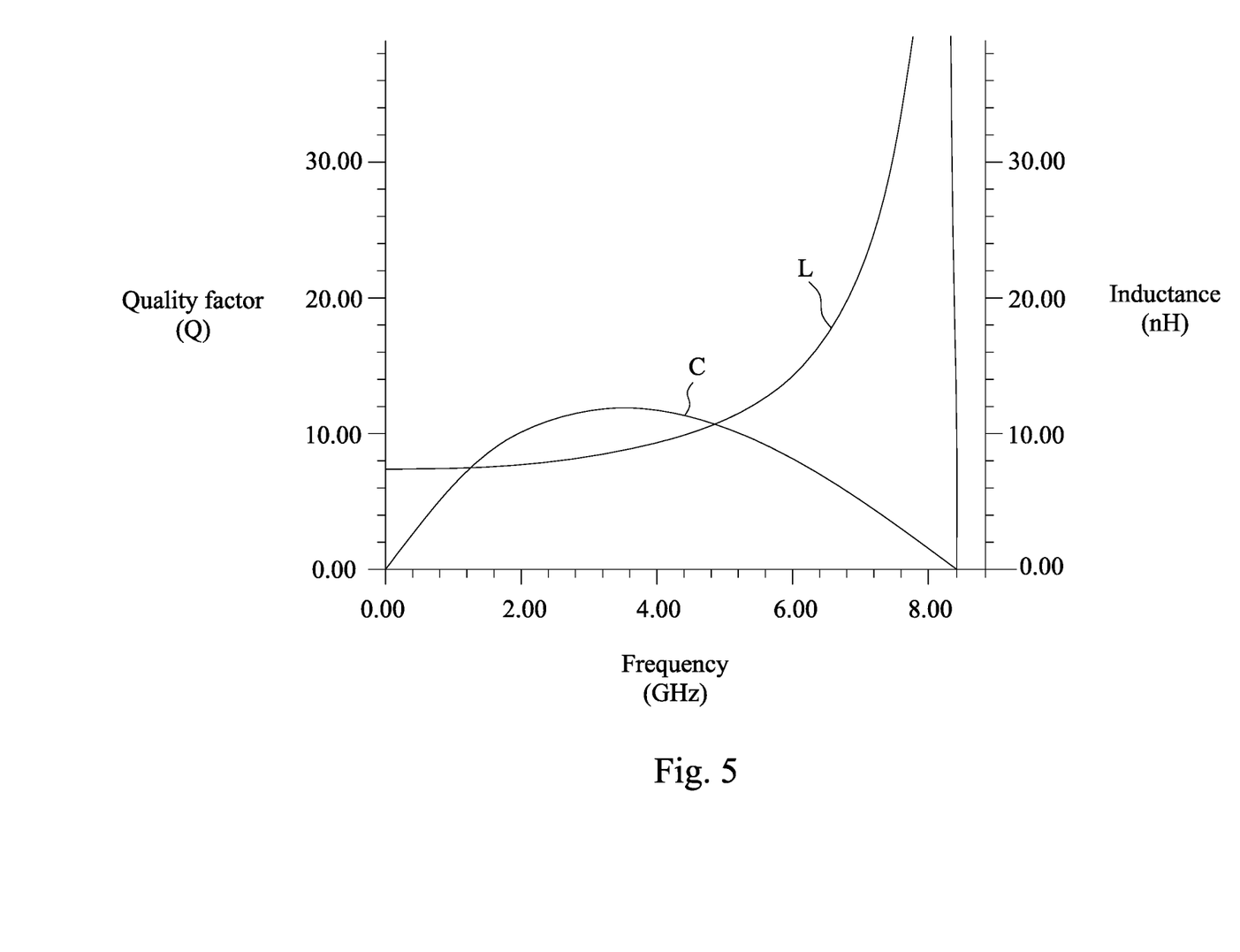
FIG. 5 depicts a schematic diagram of experimental data of an inductor device according to one embodiment of the present disclosure.

FIG. 5 depicts a schematic diagram of experimental data of the inductor device 1000A as shown in FIG. 2 according to one embodiment of the present disclosure. As shown in the figure, the experimental curve of the quality factor of the inductor device adopting the structural configuration of the present disclosure is C, and the experimental curve of the inductance value of the inductor device is L. As can be seen from the figure, the inductor device 1000A adopting the structure of the present disclosure has better quality factor. For example, at a frequency of about 3.4 GHz, the quality factor of the inductor device 1000A is about 11.3, and the inductance value of the curve L is about 8.2 nH.

It can be understood from the embodiments of the present disclosure that application of the present disclosure has the following advantages. The structure of the inductor device, especially, the structure design of the input port and the center-tap of the inductor device, is extremely symmetric. Besides, the inductance of the inductor device is enhanced through the design of the first trace and the second trace of the inductor device. In addition, the frequency where the self-resonant frequency of the inductor device occurs is effectively improved to move the frequency where the self-resonant frequency occurs to a higher frequency, thus enhancing the operation range of the inductor device and the quality factor.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An inductor device, comprising:
   a first trace disposed in a first area;
   a second trace disposed in a second area;
   a double ring inductor disposed at an outside of the first trace and the second trace, wherein the double ring inductor is respectively coupled to the first trace and the second trace in an interlaced manner; and
   a first connector coupled to traces of the double ring inductor at an outer side of the double ring inductor, wherein an entirety of the double ring inductor and the first connector are disposed on different layers.

2. The inductor device of claim 1, wherein the traces of the double ring inductor comprise:
   a third trace disposed in the first area, and coupled to the first trace in an interlaced manner; and
   a fourth trace disposed in the second area, and coupled to the second trace in an interlaced manner.

3. The inductor device of claim 2, wherein the third trace and the fourth trace are coupled to each other at a junction of the first area and the second area.

4. The inductor device of claim 3, wherein the first trace and the third trace are coupled to each other in an interlaced manner at a side which is opposite to the junction.

5. The inductor device of claim 4, wherein the second trace and the fourth trace are coupled to each other in an interlaced manner at the junction.

6. The inductor device of claim 5, wherein the first connector is coupled to the third trace and the fourth trace at a first side of the inductor device.

7. The inductor device of claim 6, wherein the double ring inductor further comprises:
   a first input/output terminal disposed in the third trace.

8. The inductor device of claim 7, wherein the first trace, the second trace, the third trace, and the fourth trace are disposed on a first layer.

9. The inductor device of claim 8, wherein the first connector is disposed on a second layer, and crosses the first input/output terminal.

10. The inductor device of claim 9, wherein the double ring inductor further comprises:
a second input/output terminal disposed in the fourth trace.

11. The inductor device of claim 10, wherein the first connector crosses the second input/output terminal.

12. The inductor device of claim 11, further comprising:
a second connector coupled to the first trace and the third trace at a side which is opposite to the junction.

13. The inductor device of claim 12, wherein the second trace and the fourth trace are coupled to each other in an interlaced manner at the junction.

14. The inductor device of claim 13, further comprising:
a third connector coupled to the second trace and the fourth trace at the junction.

15. The inductor device of claim 14, wherein the first trace comprises:
a first sub-trace disposed in the first area; and
a second sub-trace disposed in the first area, and coupled to the first sub-trace, wherein the first sub-trace and the second sub-trace are disposed on different layers.

16. The inductor device of claim 15, wherein the first sub-trace and the second sub-trace are coupled to each other in an interlaced manner at the first side of the inductor device.

17. The inductor device of claim 16, wherein the second trace comprises:
a third sub-trace disposed in the second area; and
a fourth sub-trace disposed in the second area, and coupled to the third sub-trace, wherein the third sub-trace and the fourth sub-trace are disposed on different layers.

18. The inductor device of claim 17, wherein the third sub-trace and the fourth sub-trace are coupled to each other in an interlaced manner at the first side of the inductor device.

19. The inductor device of claim 18, wherein the first trace comprise a plurality of first wires, wherein the first wires are coupled to each other in an interlaced manner at the first side of the inductor device and a second side of the inductor device, wherein the second trace comprises a plurality of second wires, wherein the second wires are coupled to each other in an interlaced manner at the first side of the inductor device and the second side of the inductor device.

20. The inductor device of claim 1, wherein the first trace and the second trace are about symmetrical to each other on a basis of a junction of the first area and the second area.

* * * * *